United States Patent [19]

Kinugasa

[11] Patent Number: 5,315,136
[45] Date of Patent: May 24, 1994

[54] DOUBLE-BALANCED MIXER
[75] Inventor: Yasushi Kinugasa, Kyoto, Japan
[73] Assignee: Rohm Co., Ltd., Kyoto, Japan
[21] Appl. No.: 41
[22] Filed: Jan. 4, 1993
[51] Int. Cl.⁵ ............ H01L 29/440; H01L 29/784; G06G 7/000; H03B 19/000
[52] U.S. Cl. ................... 257/208; 257/401; 257/365; 257/368; 307/529
[58] Field of Search ............ 257/368, 566, 401; 330/253

[56] References Cited
U.S. PATENT DOCUMENTS
4,636,663 1/1987 Jongepier et al. ............ 307/529

Primary Examiner—Rolf Hille
Assistant Examiner—David B. Hardy
Attorney, Agent, or Firm—Nikaido, Marmelstein Murray & Oram

[57] ABSTRACT

Disclosed is a semiconductor integrated circuit in which four FETs forming a double balanced mixer are adapted to exhibit uniform operational characteristics so that the double balanced mixer can properly operate to prevent distorsion of electric signals. In the present semiconductor integrated circuit at least an interconnection line connecting source electrodes of two of the four FETs to a first source electrode terminal and a counterpart interconnection line connecting source electrodes of the other two FETs to a second source electrode terminal are made to have substantially the same electrical resistance.

2 Claims, 5 Drawing Sheets

DOUBLE-BALANCED MIXER

BACKGROUND OF THE INVENTION

The present invention relates to a semiconductor integrated circuit and, more particularly, to a semiconductor integrated circuit having a double balanced mixer composed of four field effect transistors (hereinafter referred to as "FETs").

A circuit having a double balanced mixer is used to prevent distorsion of electric signals. As shown in FIG. 2, a double balanced mixer section of such a circuit is composed of four FETs 31 to 34 which are symmetrically connected to one another. Respective source electrodes 31a and 32a of the first FET 31 and the second FET 32 form a pair which is connected to a first source terminal S$_1$. Similarly, respective source electrodes 33a and 34a of a third FET 33 and the fourth FET 34 form a pair which is connected to a second source terminal S$_2$. On the other side, respective drain electrodes 31b and 33b of the first FET 31 and third FET 33 form a pair which is connected to a first drain terminal D$_1$. Similarly, respective drain electrodes 32b and 34b of the second FET 32 and fourth FET 34 form a pair which is connected to a second drain terminal D$_2$. Further, respective gate electrodes 31c and 34c of the first FET 31 and fourth FET 34 form a pair which is connected to a first gate terminal G$_1$ in order to control voltage applied to each of the FETs. Similarly, respective gate electrodes 32c and 33c of the second FET 32 and third FET 33 form a pair which is connected to a second gate terminal G$_2$.

FIG. 3 is a plan view showing an example of an conventional electrical wiring for the double balanced mixer of FIG. 2 which is formed on a semiconductor substrate. In this example, the FETs 31 to 34 are arranged so that their gate electrodes 31c to 34c are disposed parallel to one another. Around the FETs 31 to 34, there are provided bonding terminals S$_1$, S$_2$, D$_1$, D$_2$, G$_1$ and G$_2$ as external terminals which are connected to the source electrodes, drain electrodes and gate electrodes of the FETs through interconnection lines 35, respectively.

With such double balanced mixer, it is preferable to make the gate width of each FET larger because gain or noise figure (hereinafter referred to as "NF") of the mixer can be improved thereby. However, if the gate width is made large, the width of each FET would become large with the result that the interconnection line 35 connecting each FET with the corresponding bonding terminal is lengthened. In addition, some of the interconnection lines 35 would need to go around other FETs. This results in a difference in length between the interconnection lines 35. These would affect FET characteristics such as constant K to be described later because an enlarged gate width causes the source/drain resistance to decrease to a value which is substantially the same as that of the resistance of the interconnection line 35.

Further, in a portion A where the interconnection lines 35 intersect, in general the lower interconnection line is formed of a first layer line such as of titanium or aluminum provided on the surface of a semiconductor substrate, while the upper interconnection line is formed of a second layer line such as of aluminum or gold provided on an insulating film intermediate between the first and second layer lines. The sheet resistance of the first layer line per 1 cm$^2$ is about 100 mΩ, which is about 2.5 times larger than that of the second layer line, or about 40 mΩ. Accordingly, there is a great difference in resistance between an interconnection line having a first layer line and that not having the same. This results in non-uniformity in operational behavior among the four FETs. Specifically, the relation between a drain current I$_d$ of a FET and a gate voltage V$_g$ thereof is represented by the following equation:

$$I_d = K(V_g - V_{th})^2 (1 - \lambda V_{ds}) \tanh \alpha V_{ds} \quad (1)$$

where K is a constant in mA/V$^2$, Vth is a threshold voltage, λ is a channel length modulation, V$_{ds}$ is a voltage between source and drain, and α is a tanh constant.

The constant K is greatly affected by the source resistance R$_s$ or gate width W$_g$ of the FET. FIG. 4 shows the relation between the source resistance R$_s$ and a relative value of the constant K, with the gate width W$_g$ as a parameter assuming 100 μm, 200 μm, 400 μm, and 800 μm. As is clear from FIG. 4, a relative value of the constant K greatly decreases with the increase of source resistance R$_s$, and the larger the gate width W$_g$, the more conspicuously it affects the rate of change in the constant K.

FIG. 5 shows the relation between the gate width W$_g$ and the constant K, with the source resistance R$_s$ as a parameter assuming 0Ω, 0.5Ω, 0.8Ω, 1.0Ω, 1.4Ω, and 1.8Ω. As is also clear from FIG. 5, if the gate width becomes larger, the constant K greatly varies depending on the source resistance R$_s$. Accordingly, although it is preferable to make the gate width larger in view of FET characteristics, it is necessary that the four FETs should have substantially the same source resistance R$_s$ in order to realize uniformity in operational behavior among the FETs.

Further, it is known that a wafer has a variation in electric characteristics such as threshold voltage radially from the center thereof due to, for example, variation in the impurity concentration of a semiconductor substrate, and variation in the thickness of a film nitride. In a semiconductor integrated circuit, which is susceptible to this variation, there is a need to narrow the distance between adjacent FETs so as to relax the influence of variation as much as possible. In addition there can be mentioned non-uniform offsets of the gate electrodes of FETs which also account for the above-mentioned non-uniformity in operational behavior among the FETs. Offsets of a plurality of gate electrodes existing on a wafer are inevitably non-uniform even if the gate electrodes are formed by any method. Particularly, with photolithography which is frequently used for formation of a gate electrode, the alignment precision of an apparatus for photolithography is close to the gate width; hence, non-uniformity in offset among the gate electrodes is not negligible.

The present invention has been attained in view of the above-mentioned circumstances. Thus, it is an object of the present invention to provide a semiconductor integrated circuit wherein interconnection lines associated with four FETs forming a double balanced mixer are made to have substantially the same electrical resistance so as to realize uniformity in operational behavior among the FETs.

SUMMARY OF THE INVENTION

According to the present invention, there is provided a semiconductor integrated circuit comprising a double balanced mixer having first to fourth field effect transistors, wherein (a) a source electrode of the first field effect transistor and a source electrode of the second field effect transistor are connected to a first source electrode terminal through an interconnection line, while a source electrode of the third field effect transistor and a source electrode of the fourth field effect transistor are connected to a second source electrode terminal through an interconnection line;

(b) a drain electrode of the first field effect transistor and a drain electrode of the third field effect transistor are connected to a first drain electrode terminal through an interconnection line, while a drain electrode of the second field effect transistor and a drain electrode of the fourth field effect transistor are connected to a second drain electrode terminal through an interconnection line; and (c) a gate electrode of the first field effect transistor and a gate electrode of the fourth field effect transistor are connected to a first gate electrode terminal through an interconnection line, while a gate electrode of the second field effect transistor and a gate electrode of the third field effect transistor are connected to a second gate electrode terminal through an interconnection line, at least the interconnection lines connected respectively to the first and second source electrode terminals being made to have substantially the same electrical resistance.

In the present invention, it is preferable that the four FETs are identical with one another in structure and arranged in a matrix pattern, two in row and two in column, and that at least the interconnection lines connected respectively to the first and second source electrode terminals have substantially the same length.

Further, it is preferable that the interconnection lines connected respectively to the first and second drain electrode terminals have substantially the same electrical resistance.

Furthermore, it is preferable that the interconnection line connected to the first source electrode terminal or to the second source electrode terminal comprises a first layer line and a second layer line so as to cross over any of the other interconnection lines, while the interconnection line connected to the second source electrode terminal or to the first source electrode terminal also comprises a first layer line and a second layer line regardless of whether or not it two-level crosses any of the other interconnection lines, whereby the interconnection lines connected respectively to the first and the source electrode terminals are made to have substantially the same electrical resistance.

With the present invention, a pair of interconnection lines through which the four FETs are connected to a pair of electrode terminals are made to have substantially the same electrical resistance, whereby uniformity in constant K among the four FETs can be obtained. Accordingly, uniformity in operational behavior among the four FETs forming a double balanced mixer is achieved, thus causing the double balanced mixer to operate stably.

DETAILED DESCRIPTION

A double balanced mixer in a semiconductor integrated circuit of the present invention is characterized in that four FETs are arranged so as to have a matrix pattern, two in row and two in column while an interconnection line and its counterpart line which are associated with the four FETs are made to have substantially the same electrical resistance. In terms of equivalent circuit, however, it seems to be similar to the aforesaid conventional double balanced mixer having four FETs symmetrically connected to one another. Here, "to have substantially the same electrical resistance" is meant to imply that the electric characteristics of the FETs are made uniform thereby, so that the double balanced mixer is adapted to output distorsion-free signals. Specifically, "substantially the same electrical resistance" is achieved by arranging the four FETs so as to have a matrix pattern, two in row and two in column so as to make uniform the length of a pair of interconnection lines connecting the relevant FETs to the predetermined electrode terminals. In addition, if one of the pair has a portion of which the resistance is larger than other portions thereof, the counterpart line is also made to have the corresponding portion of which the resistance is larger than other portions thereof, thereby making the two interconnection lines have substantially the same resistance. Further, the matrix arrangement of the four FETs allows to dispose the four FETs close together around a certain point of a semiconductor chip, thereby reducing the influence of non-uniform characteristics of the substrate caused by wafer processing.

Figure 1:
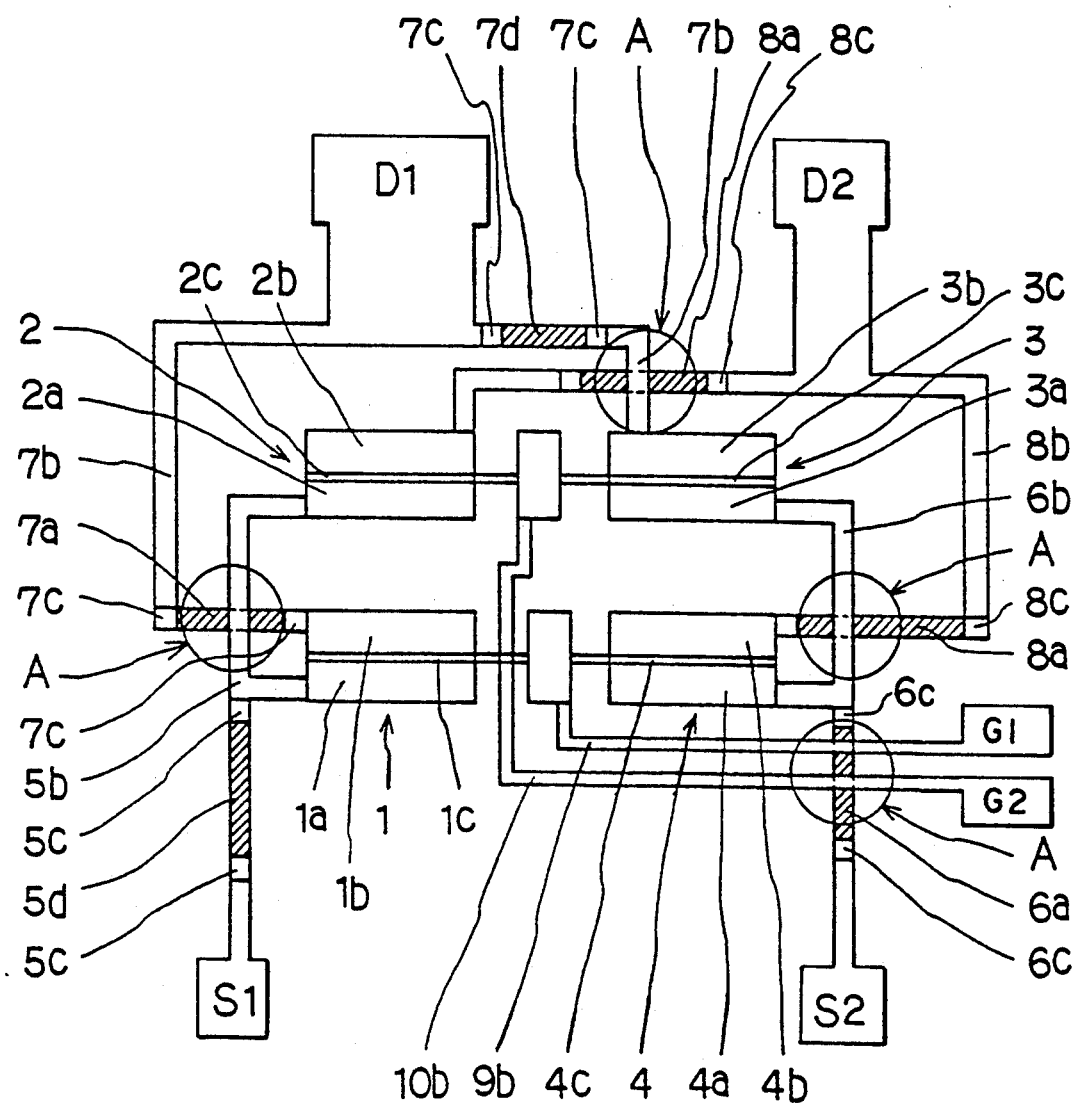
FIG. 1 is a schematic plan view showing an interconnection pattern associated with a double balanced mixer of a semiconductor integrated circuit embodying the present invention.
Figure 2:
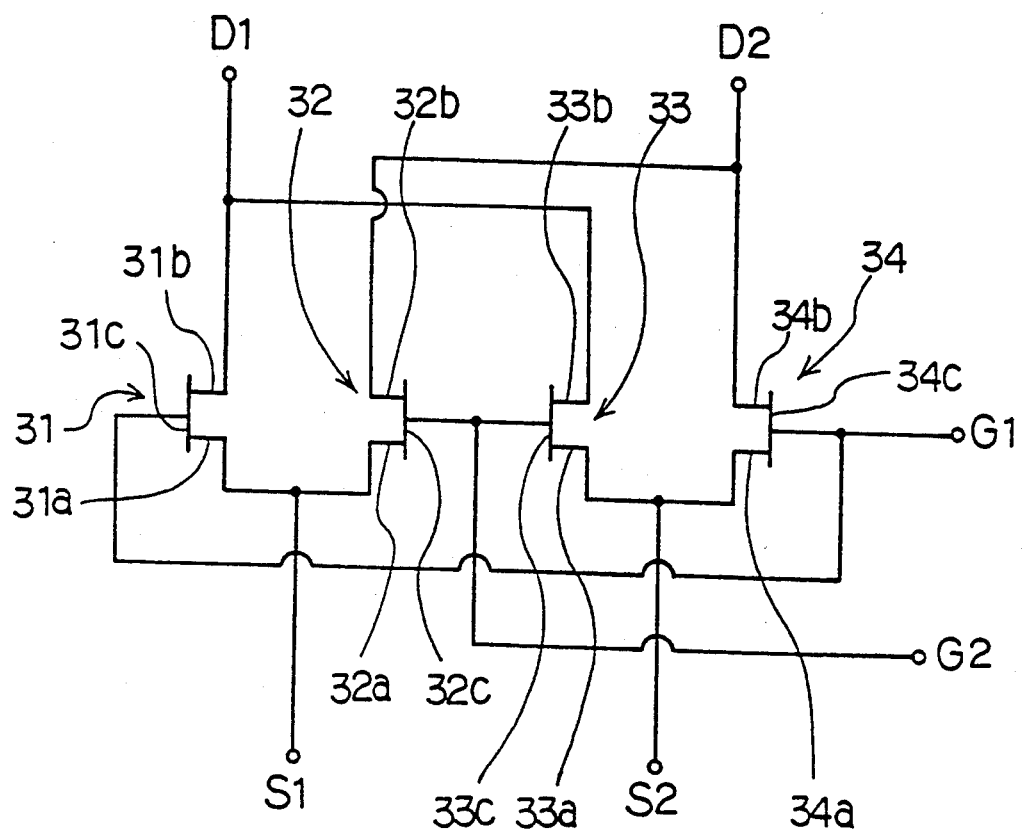
FIG. 2 is an equivalent circuit diagram of the double balanced mixer shown in FIG. 3.
Figure 3:
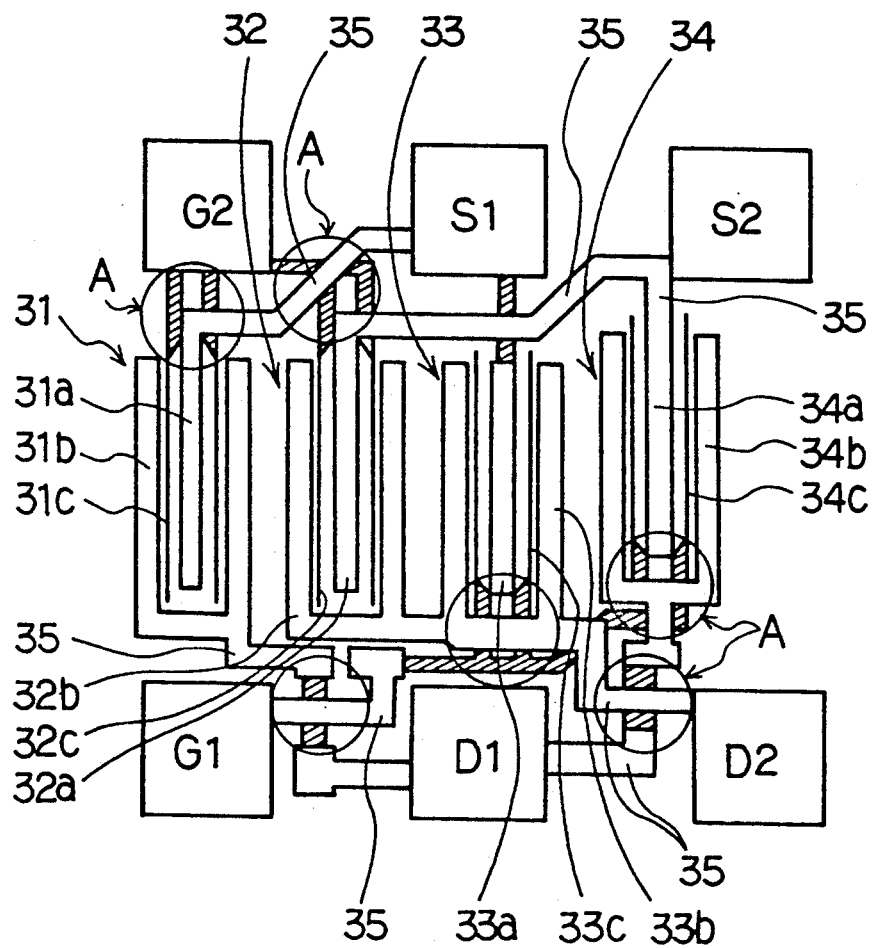
FIG. 3 is a schematic plan view showing an interconnection pattern associated with a conventional double balanced mixer.
Figure 4:
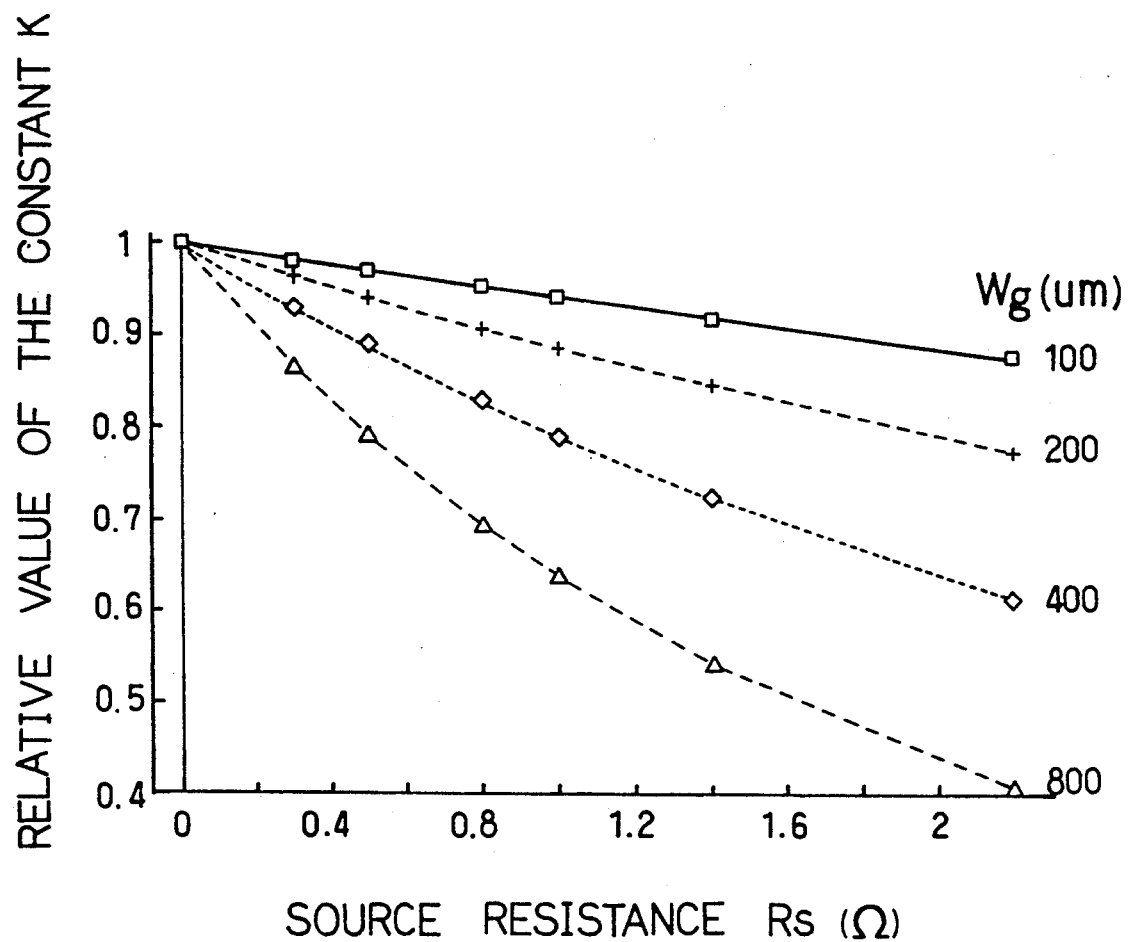
FIG. 4 is a graph representing the relation between a source resistance of a FET and a relative value of constant K, with a gate width of the FET working as a parameter.
Figure 5:
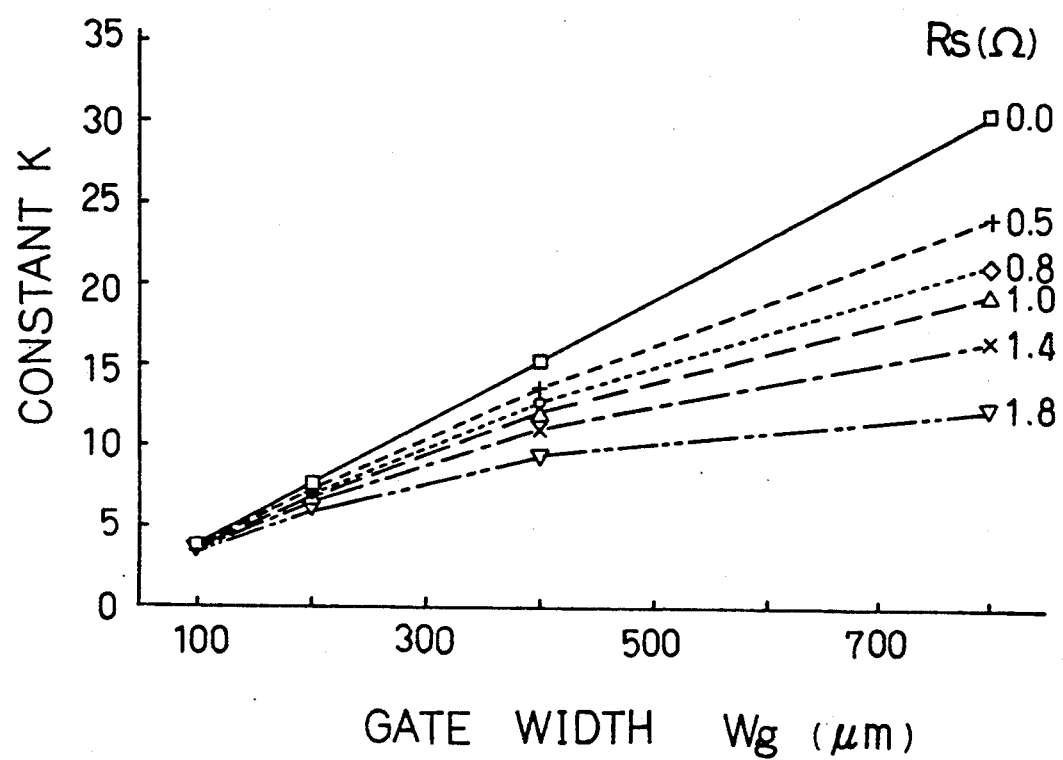
FIG. 5 is a graph representing the relation between a gate width of a FET and constant K, with a source resistance of the FET working as a parameter.

FIG. 1 is a plan view showing a metal interconnection pattern associated with a double balanced mixer incorporated in a semiconductor integrated circuit embodying the present invention. In FIG. 1, numerals 1 to 4 denote first to fourth FETs forming a double balanced mixer, wherein a source electrode 1a of the first FET 1 and a source electrode 2a of the second FET 2 are connected to a first source electrode terminal $S_1$ through an interconnection line composed of a first layer line 5d and a second layer line 5b. Numeral 5c denotes via metal portion for providing contact between the first layer line 5d and the second layer line 5b. A source electrode 3a of the third FET 3 and a source electrode 4a of the fourth FET are connected to a second source electrode terminal $S_2$ through an interconnection line composed of a first layer line 6a and a second layer line 6b which are connected to each other at via contacts 6c.

Further, a drain electrode 1b of the first FET 1 and a drain electrode 3b of the third FET 3 are connected to a first drain electrode terminal $D_1$ through an interconnection line composed of a first layer line 7a and second layer lines 7b and 7d, the first and second layer lines being connected to each other at via contacts 7c. Likewise, a drain electrode 2b of the second FET 2 and a drain electrode 4b of the fourth FET 4 are connected to a second drain electrode terminal $D_2$ through an interconnection line composed of a first layer line 8a and second layer lines 8b, the first and second layer lines being connected to each other at via contacts 8c.

Further, a gate electrode 1c of the first FET 1 and a gate electrode 4c of the fourth FET 4 are connected to a first gate electrode terminal $G_1$ through an interconnection line composed of a second layer line 9b. On the other hand, a gate electrode 2c of the second FET 2 and a gate electrode 3c of the third FET 3 are connected to a second gate electrode terminal $G_2$ through an interconnection line composed of a second layer line 10b.

The four FETs 1 to 4 thus connected form a double balanced mixer. In this constitution the first layer lines 6a, 7a, 8a, 5d, and 7d are provided directly on a semiconductor substrate. Therefore, the four FETs need to be composed of a material having little interaction with the substrate such as a multilayered metal material comprising titanium, platinum, gold or the like, or aluminum or the like. On the other hand, the second layer lines 5b, 6b, 7b, 8b, 9b, and 10b are provided on an interlayer insulating film and composed of a metal film line such as of aluminum or gold. From the viewpoint of the ease of sputtering for the interconnection lines and the respective resistances of the first and second layer lines (resistance of a 0.8 $\mu$m thick gold line between both ends thereof is 40 m$\Omega$ per 1 cm$^2$, whereas that of a multilayered line composed of titanium, platinum and gold is 100 m$\Omega$ under the same conditions.), all the interconnection lines are preferably composed of a second layer line. However, some of the interconnection lines need to have first and second layer lines so as to realize crossing over a portion A. Hence, the counterpart interconnection lines are also made to have first and second layer lines. Even if the first layer line is formed by using aluminum, the thickness of the first layer line cannot be thick. Then, the resistance of the first layer line relative to the second layer line increase. The via metal portion, which connects a first layer line and a second layer line, is made by forming a contact hole extending through the interlayer insulating film and refilling it with a multi layered metal material such as titanium, platinum, gold or the like. If the number of the via metal portion increases, the resistance of an interconnection line also increases.

In the present invention non-uniformity in operational behavior among the four FETs caused by the difference in resistance between the interconnection lines is corrected by making a pair of interconnection lines having substantially the same resistance or disposing them substantially symmetrically. In detail, although the first layer line 5d connected to the first source electrode terminal $S_1$ is usually composed of a second layer line, it is herein composed of a first layer line so as to be evenly balanced with the counterpart line 6a connected to the second source electrode terminal $S_2$, which line 6a must be composed of a first layer line because of crossing over. As a result, the interconnection lines associated with the first and second source electrode terminals $S_1$ and $S_2$ have the same number of via metal portions, and are, hence, in a substantially symmetric configuration. And the first layer line 7d connected to the first drain electrode terminal $D_1$ and the first layer line 8a connected to the second drain electrode terminal $D_2$.

In forming a symmetric configuration of interconnection lines, the interconnection lines associated with the source electrode terminals $S_1$ and $S_2$ need to have substantially the same resistance because the gate-source voltage $V_{gs}$, which remarkably affects on the electrical characteristics, especially is sensitively affected by the difference in resistance therebetween. With respect to the interconnection lines associated with the drain electrode terminals $D_1$ and $D_2$, it is preferable that they also have substantially the same resistance. However, the interconnection lines associated with the gate electrode terminals $G_1$ and $G_2$ do not necessarily have substantially the same resistance because little current flows through the respective gate electrodes of the four FETs.

It should be understood that although the above embodiment has a pair of symmetric interconnection lines having the same structure, the pair of lines are not necessarily composed of the same material and do not necessarily have the same length if they can have substantially the same resistance. For example, even if the two interconnection lines in a pair are different in length and in resistance, they can be made to have substantially the same resistance by adding a wiring segment having a resistance equivalent to the difference in resistance between the two interconnection lines to one of the pair which is smaller in resistance.

As has been described, according to the present invention a pair of interconnection lines associated with FETs constituting a double balanced mixer are made to have substantially the same resistance so as to cause the FETs to operate uniformly. Therefore, a high-performance double balanced mixer which is substantially free from signal distorsion can be obtained. As a result, the semiconductor integrated circuit having such an excellent double balanced mixer according to the present invention can effectively be utilized in a differential logic circuit or a like circuit.

Though several embodiments of the present invention are described above, it is to be understood that the present invention is not limited only to the above-mentioned, various changes and modifications may be made in the invention without departing from the spirit and scope thereof.

What is claimed is:

1. A semiconductor integrated circuit comprising:
   a double balanced mixer having first to fourth field effect transistors, wherein
   (a) a source electrode of the first field effect transistor and a source electrode of the second field effect transistor are connected to a first source electrode terminal through a first interconnection line, while a source electrode of the third field effect transistor and a source electrode of the fourth field effect transistor are connected to a second source electrode terminal through a second interconnection line;
   (b) a drain electrode of the first field effect transistor and a drain electrode of the third field effect transistor are connected to a first drain electrode terminal through a third interconnection line, while a drain electrode of the second field effect transistor and a drain electrode of the fourth field effect transistor are connected to a second drain electrode terminal through a fourth interconnection line; and
   (c) a gate electrode of the first field effect transistor and a gate electrode of the fourth field effect transistor are connected to a first gate electrode terminal through a fifth interconnection line, while a gate electrode of the second field effect transistor and a gate electrode of the third field effect transistor are connected to a second gate electrode terminal through a sixth interconnection line, at least the first and second interconnection lines respectively connected to the first and second source electrode terminals being made to have electrical resistance which are essentially equal to each other;

wherein if one interconnection line of the first interconnection line and the second interconnection line comprises a first layer line and a second layer line so as to cross over any of the other interconnection lines, then the other one of the first and second interconnection lines also comprises a first layer line and a second layer line regardless of whether or not said other of the first and second interconnection lines two-level crosses any of the other interconnection lines, wherein the first and second interconnection lines connected respectively to said first and second source electrode terminals are made to have electrical resistances which are essentially equal to each other.

2. The semiconductor integrated circuit as set forth in claim 1, wherein the third and fourth interconnection lines connected respectively to said first and second drain electrode terminals have electrical resistances which are essentially equal to each other.

* * * * *